United States Patent
Kalnitsky et al.

(10) Patent No.: US 9,722,015 B1
(45) Date of Patent: Aug. 1, 2017

(54) CAPACITOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Alexander Kalnitsky, San Francisco, CA (US); Felix Ying-Kit Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/283,833

(22) Filed: Oct. 3, 2016

(51) Int. Cl.
*H01L 21/8242* (2006.01)
*H01L 49/02* (2006.01)
*H01L 21/762* (2006.01)

(52) U.S. Cl.
CPC ........ *H01L 28/91* (2013.01); *H01L 21/76232* (2013.01)

(58) Field of Classification Search
CPC .................. H01L 21/76232; H01L 28/91
USPC ......................................... 438/243
See application file for complete search history.

(56) References Cited

U.S. PATENT DOCUMENTS

| | | | |
|---|---|---|---|
| 6,770,563 B2* | 8/2004 | Huang | H01L 29/66181 257/E21.233 |
| 9,178,080 B2 | 11/2015 | Kalnitsky et al. | |
| 2009/0100388 A1* | 4/2009 | Kemerer | H01L 29/945 716/106 |
| 2012/0211865 A1* | 8/2012 | Tian | H01L 27/0805 257/532 |

* cited by examiner

*Primary Examiner* — David S Blum
(74) *Attorney, Agent, or Firm* — WPAT, P.C., Intellectual Property Attorneys; Anthony King

(57) ABSTRACT

The present disclosure provides a capacitor structure, including a substrate having a conductive region; a trench in the conductive region and having a bottom portion and an inner sidewall portion; a spacer over the inner sidewall portion of the trench; a first conductive layer over the bottom portion and the spacer in the trench; a first dielectric layer over the first conductive layer and in the trench; a second conductive layer over the first dielectric layer and in the trench; and a second dielectric layer over the second conductive layer and in the trench, wherein the spacer comprises an angle in a range of from about 85 to about 89 degrees with respect to the bottom portion of the trench and comprises a flared opening opposite to the bottom portion of the trench. The present disclosure also provides a method for manufacturing the capacitor structure.

20 Claims, 14 Drawing Sheets

CAPACITOR STRUCTURE AND METHOD FOR MANUFACTURING THE SAME

FIELD

The present disclosure relates to a capacitor structure and a method for manufacturing the same.

BACKGROUND

Capacitors are used for a myriad of purposes on modern integrated circuits. For example, decoupling capacitors are used to decouple one part of an electrical circuit, such as interconnect, from another part of the circuit. In such a configuration, noise arising from the interconnect can be shunted through a decoupling capacitor to reduce the effects of interconnect noise on the remainder of the circuit. Since such capacitors are often placed close to the circuit to eliminate parasitic inductances and resistances associated with the interconnect, there is a need to create a high density capacitor in either the IC technology of interest or in a stand alone process that results in an integrated capacitor device easily mountable on the IC.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
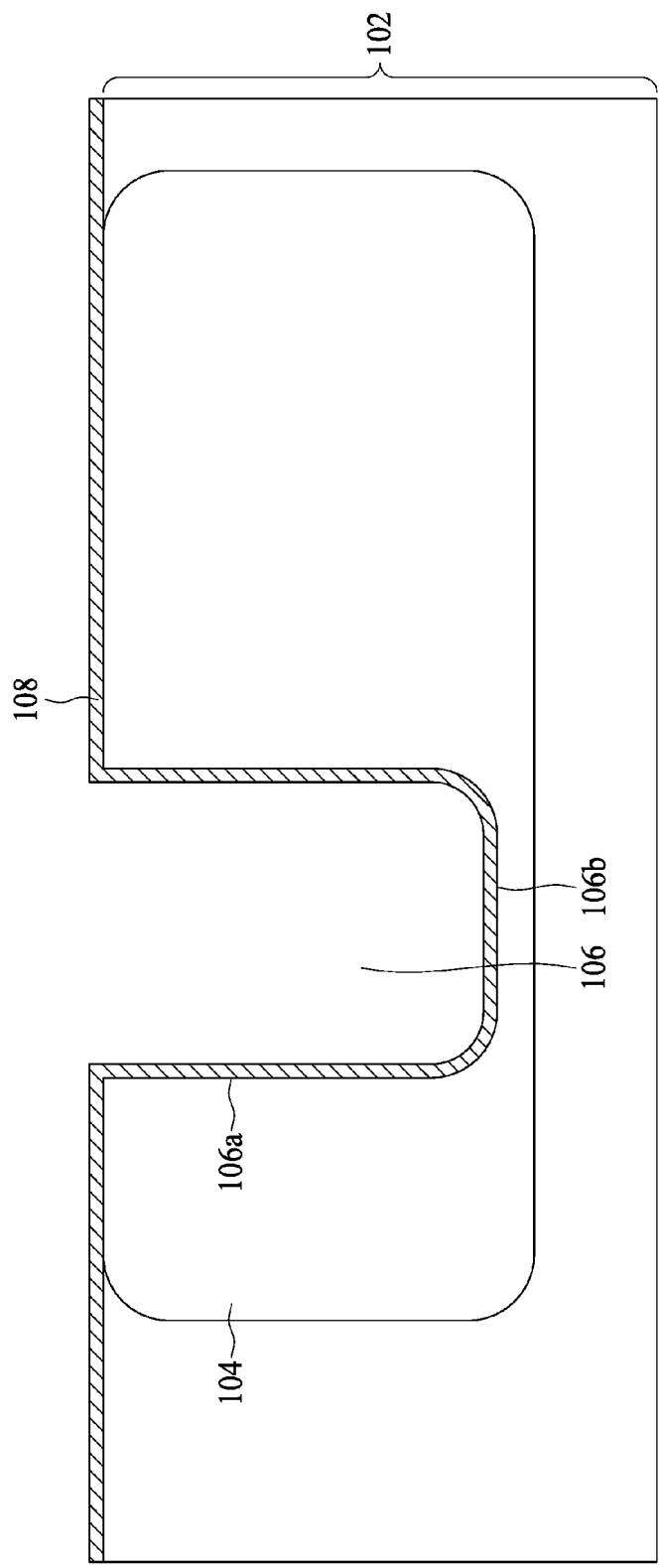
FIGS. 1 through 6 illustrate the cross-sectional views of intermediate stages in the formation of a capacitor structure in accordance with some embodiments of the present disclosure.

In the drawings, like reference numbers are used to designate like or similar elements throughout the various views and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Further, spatially relative terms, such as "beneath." "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

As will be appreciated further herein, the present disclosure relates to improved techniques for high-density capacitors, which are formed in an integrated circuit process or in a stand-alone technology for subsequent wafer level or chip level interconnect between an IC and a capacitor chip. In these high density capacitors, two or more deep trench capacitors are "stacked" over one another and are coupled in parallel to increase capacitance density, relative to conventional implementations. Although several examples are illustrated and described below, these examples do not in any way limit the scope of the present disclosure.

In a conventional capacitor structure, for example a deep trench capacitor, there are seams or voids in conductive layers within trenches due to the high aspect ratio of the trenches. Such seams or voids make the wafer fragile under mechanical stress in subsequent package processes, and also induce die cracks and reliability issues.

The present disclosure provides a sloped spacer in a capacitor structure to avoid seams or voids in conductive layers within the trench. In some embodiments, the sloped spacer is composed of materials same as the electrodes. In other embodiments, the sloped spacer is composed of an insulating layer. Accordingly, the capacitor structure described herein provides better fragile-resistance, and further increases a trench etch window by providing a sloped profile.

FIGS. 1 through 6 illustrate the cross-sectional views of intermediate stages in the formation of a capacitor structure in accordance with some embodiments of the present disclosure.

Referring to FIG. 1, a semiconductor substrate 102, which is often a silicon wafer having a first conductivity type (e.g., P−) is provided. A doped conductive region 104, which often has a second conductivity type (e.g., N++) is formed within the semiconductor substrate 102, and at least one trench 106 extends downward from an upper surface 102*a* of the semiconductor substrate 102 into the conductive region 104.

The trench 106 has a bottom portion 106b and an inner sidewall portion 106a. A first insulating layer 108 is conformally deposited over the bottom portion 106b and the inner sidewall portion 106a of the trench 106. In some embodiments of the present disclosure, the first insulating layer 108 may be an oxide layer.

Figure 2:
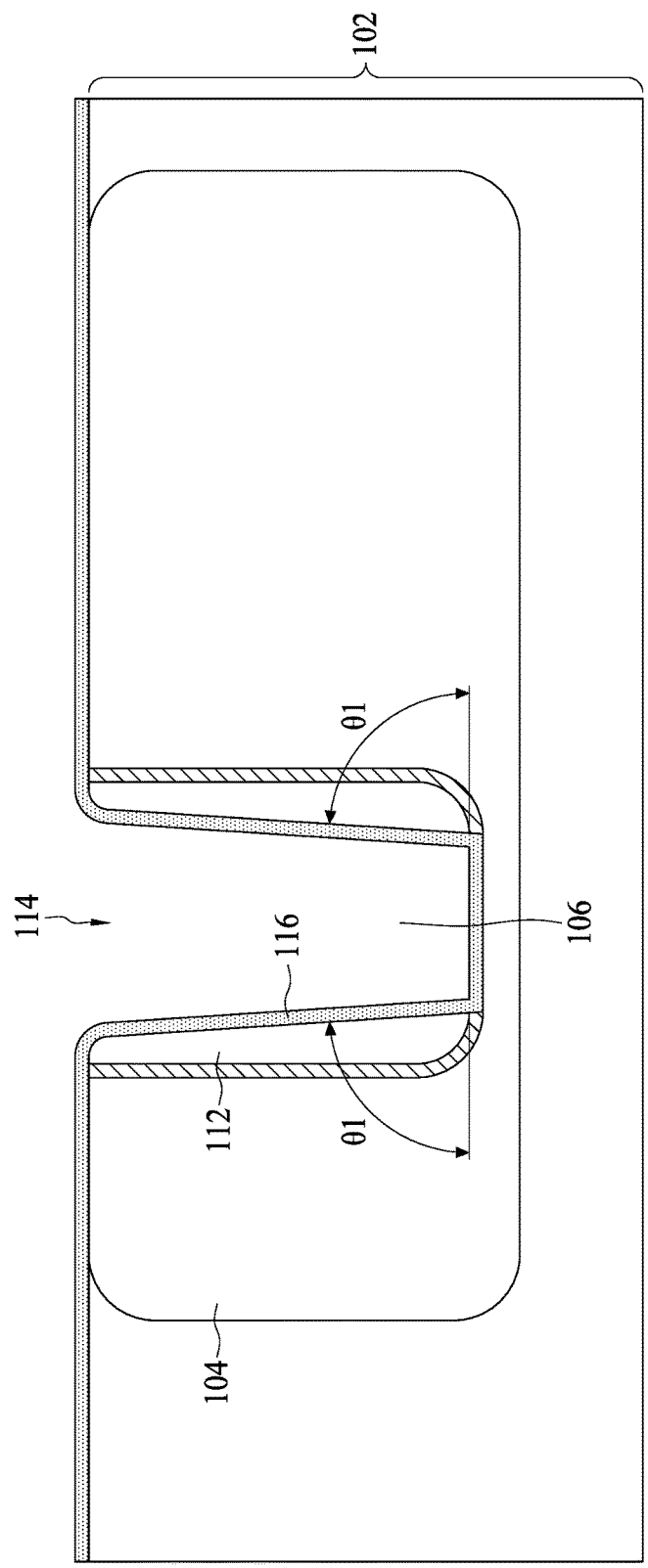

Referring to FIG. 2, a thin polysilicon layer (not shown) is conformally deposited over the first insulating layer 108 in the trench 106. The thin polysilicon layer is then etched to remove a second portion of the thin polysilicon layer and a portion of the first insulating layer 108 over the bottom portion 106a of the trench 106 so as to form a spacer 112 over the inner sidewall portion 106b of the trench 106. The spacer 112 is etched to have an angle θ1 in a range of from about 85 to about 89 degrees with respect to the bottom portion 106a of the trench 106 and a flared opening 114 opposite to the bottom portion 106a of the trench 106. Subsequently, a second insulating layer 116 is formed over the bottom portion 106a of the trench 106. In some embodiments of the present disclosure, the second insulating layer 116 may be an oxide layer, for example.

Figure 3:
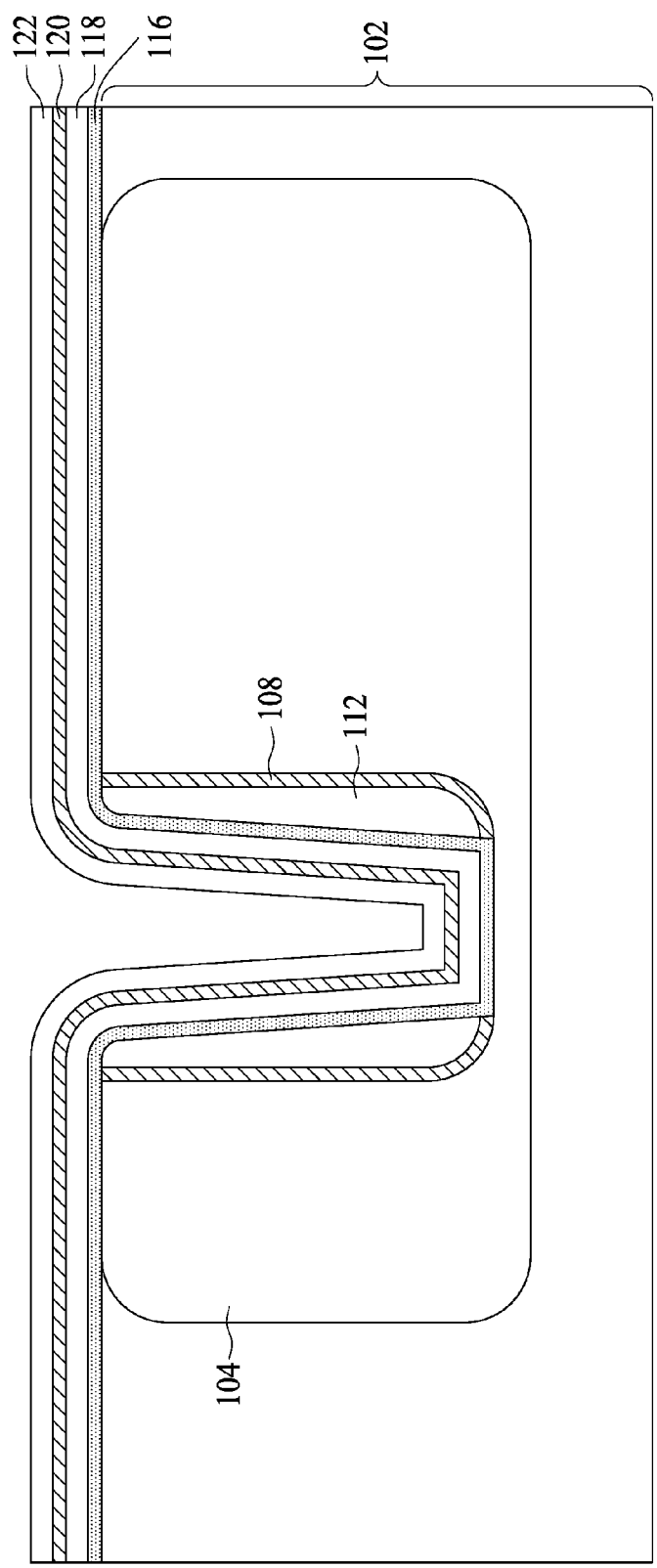
Figure 4:
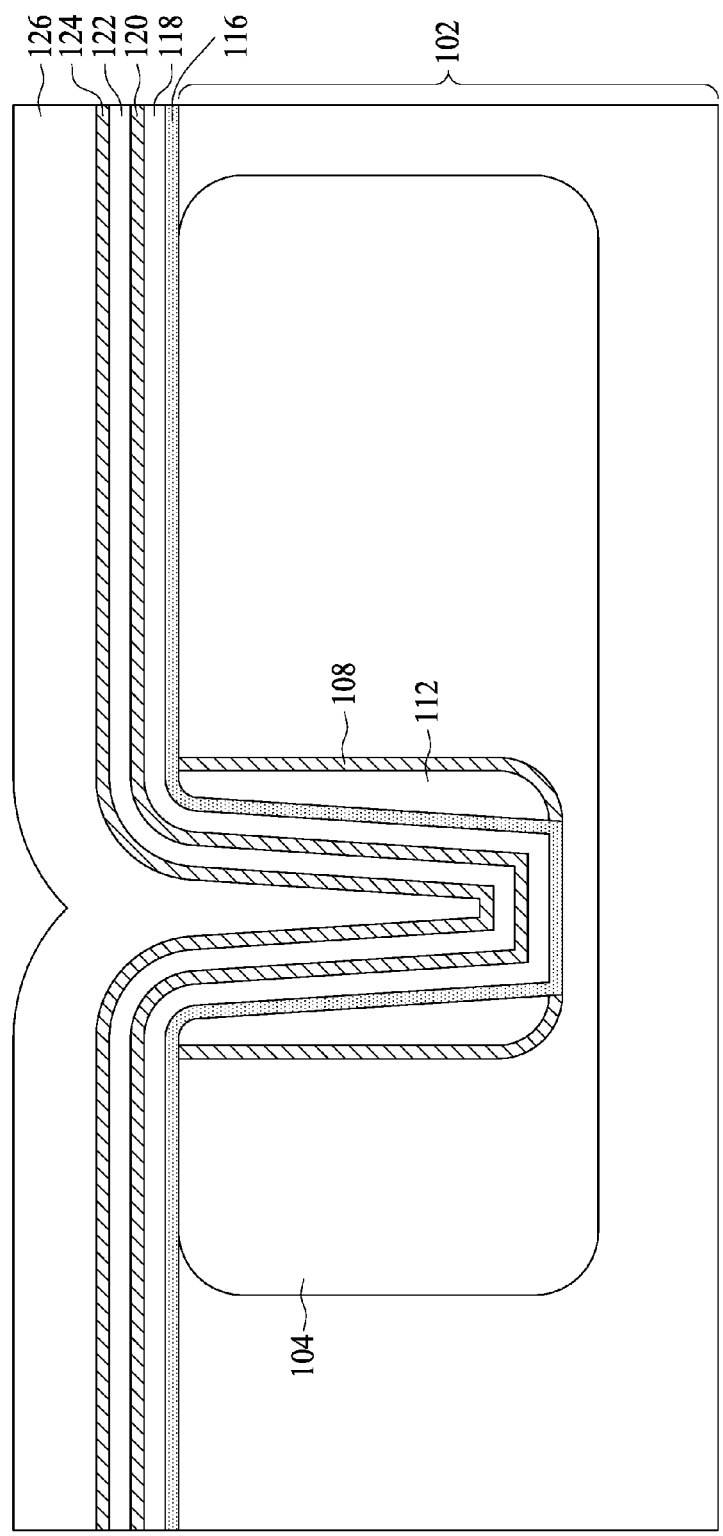

Referring to FIG. 3, a first conductive layer 118 is conformally deposited over the spacer 112 and the bottom portion 106a of the trench 106. A first dielectric layer 120 is conformally deposited over the first conductive layer 118. A second conductive layer 122 is deposited over the first dielectric layer 120. Referring to FIG. 4, a second dielectric layer 124 is conformally deposited over the second conductive layer 122. A third conductive layer 126 is conformally deposited over the second dielectric layer 124. In some embodiments of the present disclosure, the first, second and third conductive layers 118, 122, 126 may be made of polysilicon.

Figure 5:
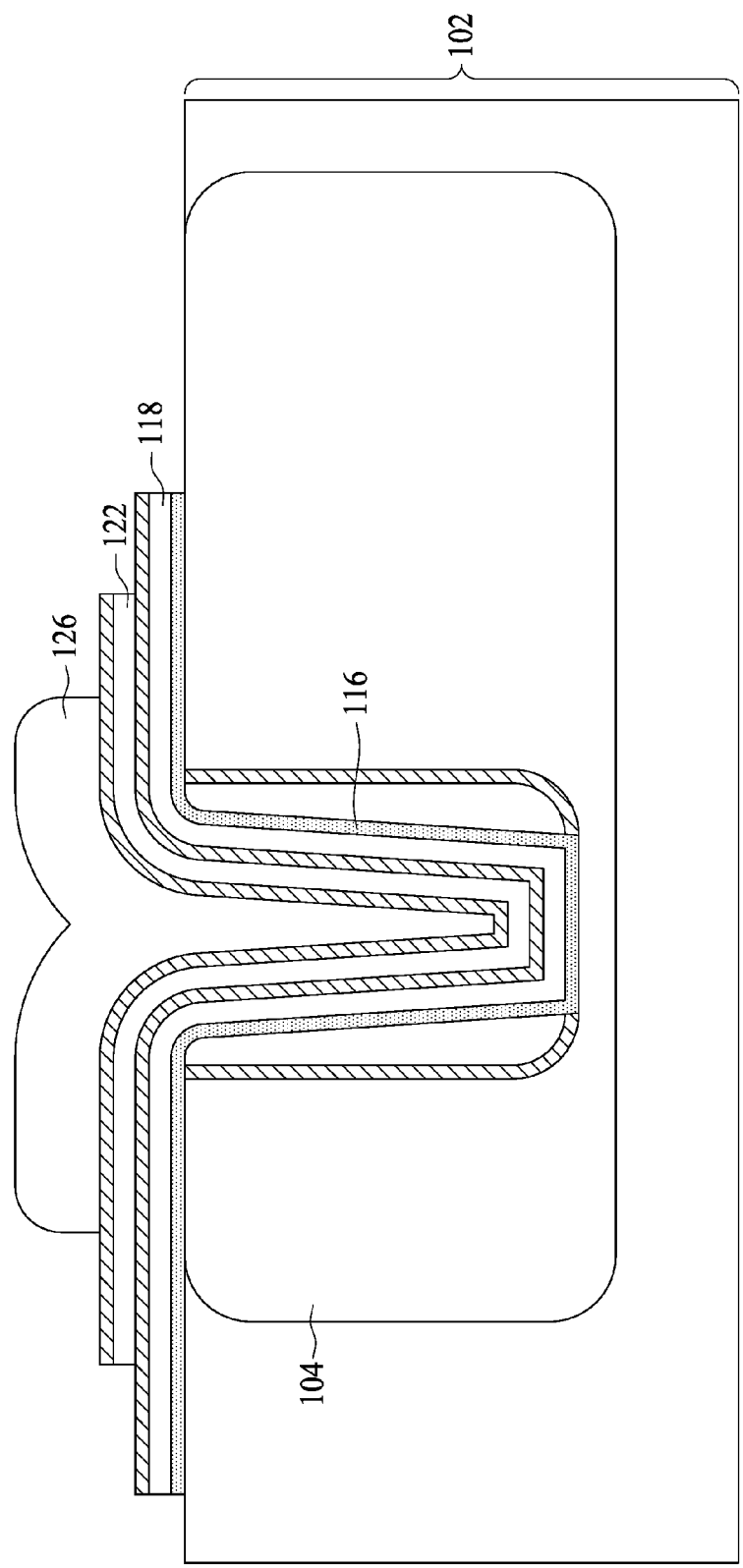

Referring to FIG. 5, photolithography and etching are performed on the third conductive layer 126 to define a third electrode 126 of the capacitor structure. Photolithography and etching are performed on the second conductive layer 122 to define a second electrode 122 of the capacitor structure, and then photolithography and etching are performed on the first conductive layer 118 to define a first electrode 118 of the capacitor structure.

Figure 6:
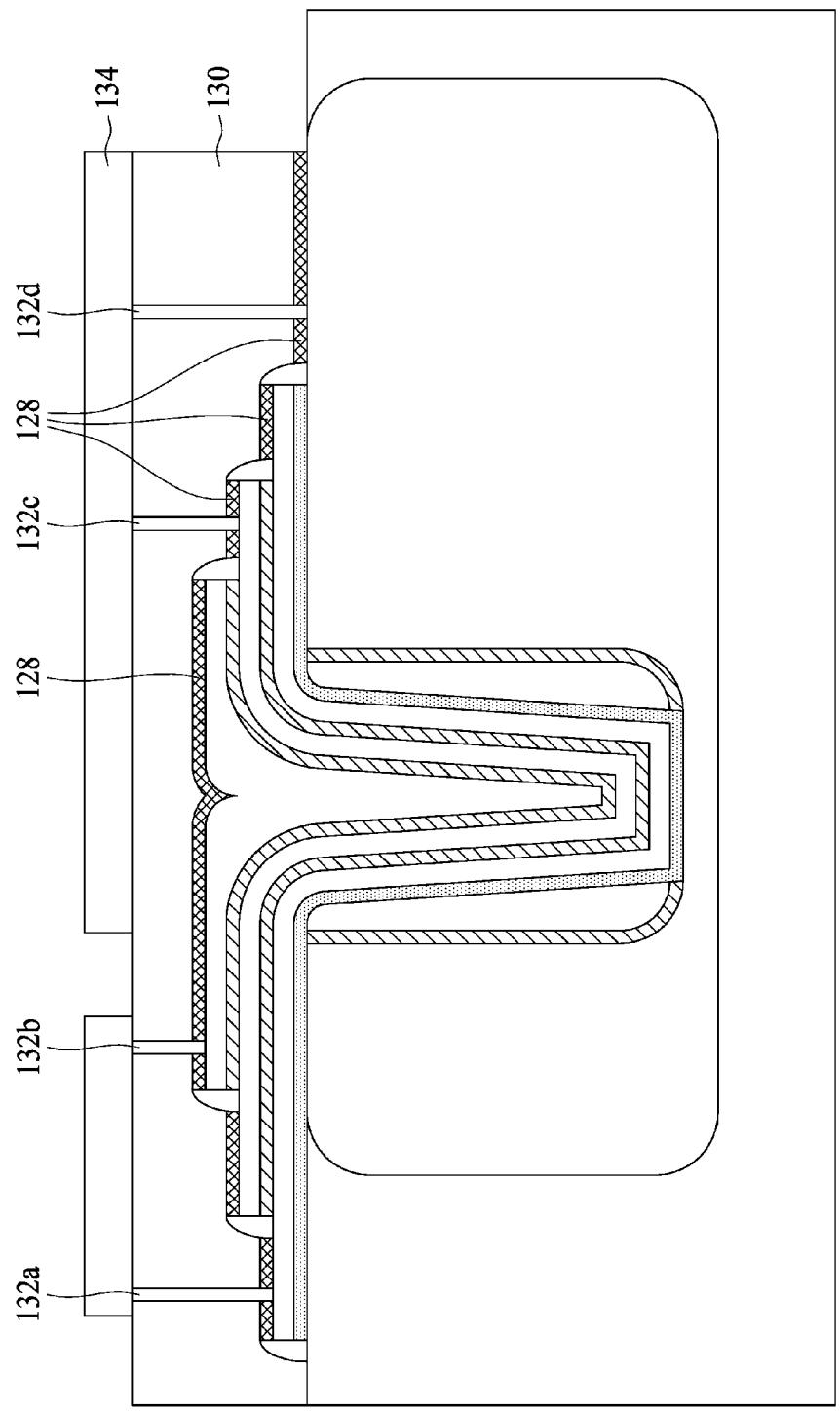

Referring to FIG. 6, a self-aligned silicide (salicide) operation is then performed on the first conductive layer 118, the second conductive layer 122, and the third conductive layer 126 to form a silicide layer 128 only on the exposed top surface of the conductive layers 118, 122, 126. An interlayer dielectric (ILD) layer 130 is formed over the silicide layer 128. An interconnect structure including contacts 132a-132d and a metal layer 134 are formed in and over the ILD layer 130.

Figure 7:
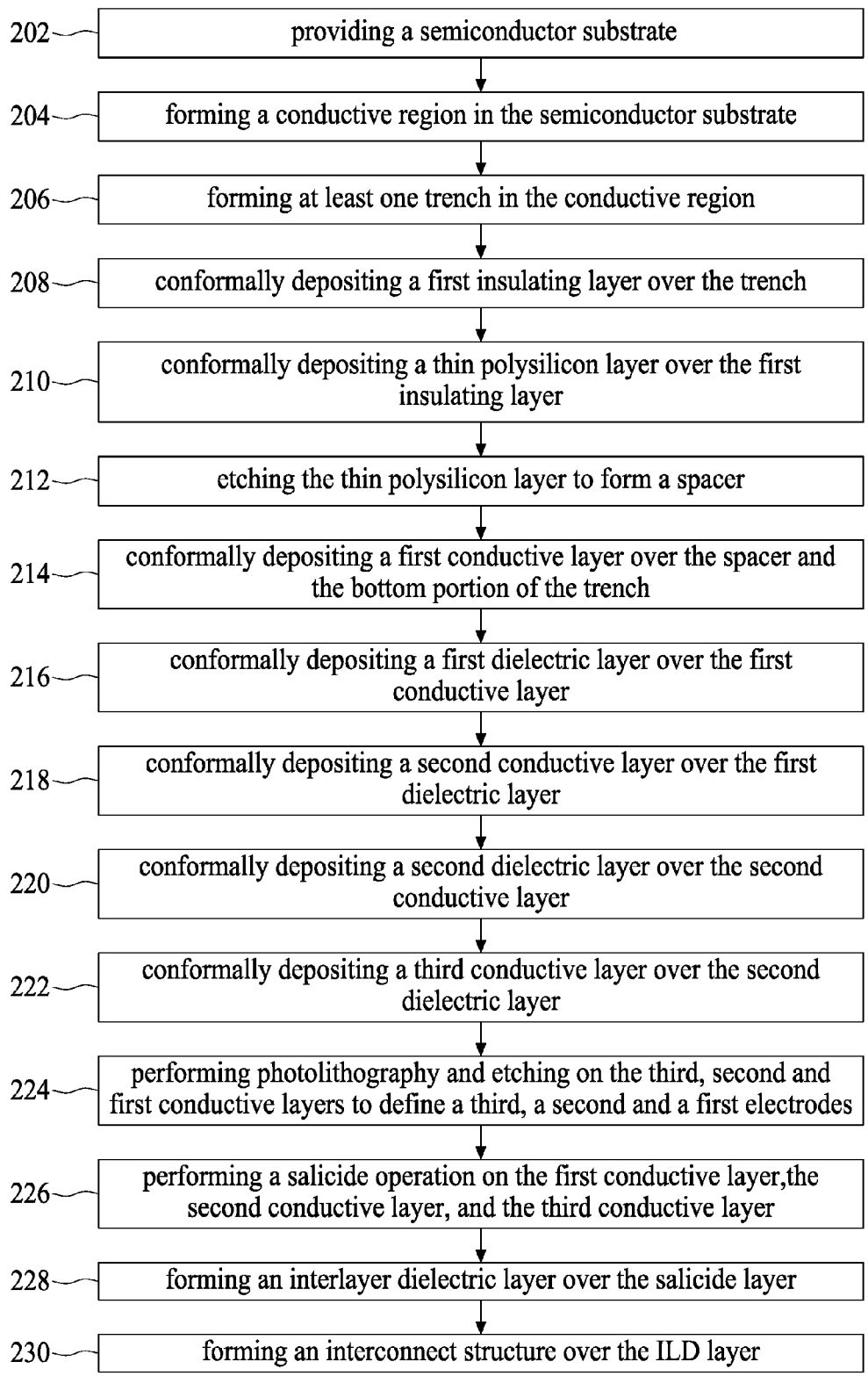
FIG. 7 is a flow-chart illustrating an exemplary method for manufacturing the capacitor structure shown in FIG. 6.

FIG. 7 is a flow-chart illustrating an exemplary method for manufacturing the capacitor structure shown in FIG. 6. It will be appreciated that, for purposes of simplicity and readability, some steps may be omitted from what is illustrated and described below, and that other steps may be used in addition to (or in place of) those illustrated and described below. Referring to FIG. 7 and the structures shown in FIGS. 1 to 6, the manufacturing method of the present disclosure is described below.

In operation 202, a semiconductor substrate 102 is provided. The semiconductor 10o substrate 102 can be a bulk semiconductor wafer having a first conductivity type at a first doping concentration. For example, the semiconductor substrate 102 can be a silicon wafer that is lightly doped with a p-type dopant, or can be heavily doped with a p-type dopant. The semiconductor substrate 102 can be implemented as a bulk silicon wafer substrate, a binary compound substrate (e.g., GaAs wafer), a ternary compound substrate (e.g., AlGaAs), or higher order compound wafers, among others. Further, the semiconductor substrate 102 can also include non-semiconductor materials such as oxide in silicon-on-insulator (SOI) partial SOI substrate, polysilicon, amorphous silicon, or organic materials, among others. In some embodiments of the present disclosure, the semiconductor substrate 102 can include multiple wafers or dies which are stacked or otherwise adhered together.

In operation 204, a conductive region 104 is formed in the semiconductor substrate 102. The conductive region 104 has a second doping type that is opposite the first doping type. In operation 206, at least one trench 106 is formed in the conductive region 104. The at least one trench 106 is formed by providing a trench mask (not shown), and performing etching (e.g., a plasma etch) with the trench mask in place. The trench mask can be a photoresist mask or a hard mask, such as an oxide or a nitride mask for example. The trench 106 has a bottom portion 106a and an inner sidewall portion 106b. In operation 208, a first insulating layer 108 is conformally deposited over the bottom portion 106a and the inner sidewall portion 106b of the trench 106. In some embodiments of the present disclosure, the first insulating layer 108 may be an oxide layer. Then, in operation 210, a thin polysilicon layer is conformally deposited over the first insulating layer 108 in the trench 106.

In operation 212, the thin polysilicon layer is etched to remove a first portion of the thin polysilicon layer over a second portion of the thin polysilicon layer and a portion of the first insulating layer 108 over the bottom portion 106a of the trench 106 so as to form a spacer 112 over an inner sidewall portion 106b of the trench 106. The spacer 112 is etched to have an angle θ1 in a range of from about 85 to about 89 degrees with respect to the bottom portion of the trench and a flared opening opposite to the bottom portion of the trench.

In operation 212, a second insulating layer 116 is further formed over the bottom portion of the trench. In some embodiments of the present disclosure, the second insulating layer 116 may be an oxide layer deposited over the bottom portion 106b of the trench 106. In 1o operation 214, a first conductive layer 118 is conformally deposited over the spacer 112 and the bottom portion 106 of the trench 106. In some embodiments of the present disclosure, the first conductive layer 118 is formed by in-situ doped low-pressure CVD. In other embodiments, the first conductive layer 118 can also be formed of conductive materials other than polysilicon, such as metal for example. In operation 216, a first dielectric layer 120 is conformally deposited over the first conductive layer 118. To form the first dielectric layer 120 over the first conductive layer 118 within the trench 106, a well-known three step process can be used to achieve consistent conformal deposition over the workpiece features. In a first step, a thermal oxidation can be performed to form a thin oxide layer. In a second step, a low pressure chemical vapor deposition (CVD) is provided to form a nitride layer over the oxide layer. In a third step, another oxidation step is performed, such that the first dielectric layer can be an oxide-nitride-oxide (ONO) structure. In some embodiments of the present disclosure, the first dielectric layer can be made of a metal oxide or high K dielectrics. Examples of these include HfO, $Al_2O_3$, ZrO, $Ta_2O_5$ and the like.

In operation 218, a second conductive layer 122 is conformally deposited over the first dielectric layer 120. In some embodiments of the present disclosure, the second conductive layer 122 is formed by in-situ doped low-pressure CVD. In other embodiments, the second conductive layer 122 can also be formed of conductive materials other than polysilicon, such as metal for example. In operation 220, a second dielectric layer 124 is conformally deposited over the second conductive layer 122. To form the second dielectric layer 124 over the second conductive layer 122 within the trench 106, a well-known three step process can be used to achieve consistent conformal deposition over the workpiece features. In a first step, a thermal oxidation can be performed to form a thin oxide layer. In a second step, a low pressure chemical vapor deposition (CVD) is provided to form a nitride layer over the oxide layer. In a third step, another oxidation step is performed, such that the first dielectric layer can be an oxide-nitride-oxide (ONO) structure. In some embodiments of the present disclosure, the second dielectric layer can be made of a metal oxide or high K dielectrics. Examples of these include HfO, $AlO_3$, ZrO, $Ta_2O_5$ and the like.

In operation 222, a third conductive layer 126 is conformally deposited over the second dielectric layer 124. In some embodiments of the present disclosure, the third conductive layer 126 is formed by in-situ doped low-pressure CVD. In other embodiments, the third conductive layer 126 can also be formed of conductive materials other than polysilicon, such as metal for example. In operation 224, photolithography and etching are performed on the third, second and first conductive layers to define a third, second and first electrodes of the capacitor structure, respectively.

In operation 226, self-aligned silicide (salicide) operation is then performed on the first conductive layer 118, the second conductive layer 122, and the third conductive layer 126 to form a silicide layer 128 only on the exposed top surface of the conductive layers 118, 122, 126. In operation 228, an interlayer dielectric (ILD) layer 130 is formed over the silicide layer 128. In some embodiments of the present disclosure, the ILD layer 130 has a thickness of approximately 1000 angstroms and a dielectric constant ranging from approximately 3.0 to approximately 8.5, although other thicknesses and dielectric constants could also be used.

In operation 230, an interconnect structure 132 including contacts 132a-132d and a metal layer 134 is formed over the ILD layer 130. In this way, as shown in FIG. 6, the capacitor structure 100 of the present disclosure is formed.

FIGS. 8 through 13 illustrate the cross-sectional views of intermediate stages in the formation of a capacitor structure in accordance with some embodiments of the present disclosure.

Figure 8:
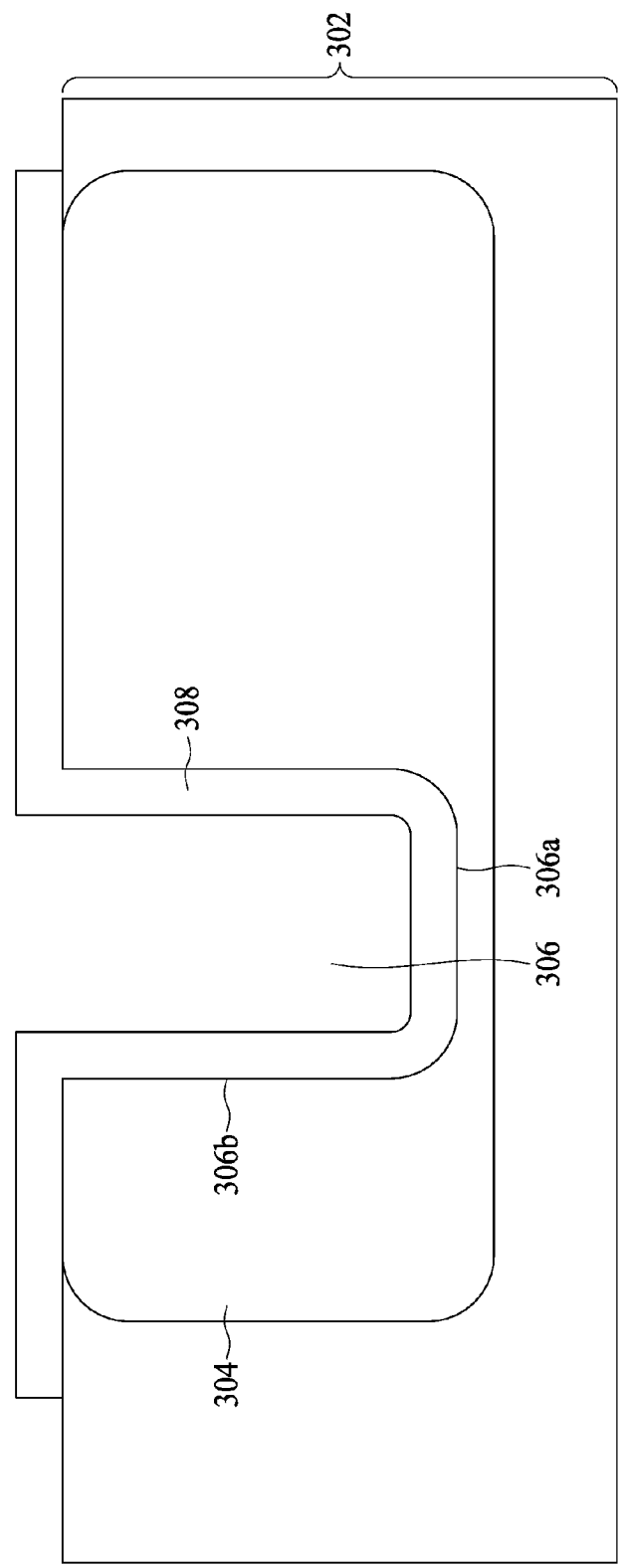
FIGS. 8 through 13 illustrate the cross-sectional views of intermediate stages in the formation of a capacitor structure in accordance with some embodiments of the present disclosure.

Referring to FIG. 8, a semiconductor substrate 302, which is often a silicon wafer having a first conductivity type (e.g., P−) is provided. A doped conductive region 304, which often has a second conductivity type (e.g., N++) is formed within the semiconductor substrate 302, and at least one trench 306 extends downward from an upper surface of the semiconductor substrate 302 into the conductive region 304. The trench 306 has a bottom portion 306a and an inner sidewall portion 306b. An insulating layer 308 is conformally deposited over the bottom portion 306a and the inner sidewall portion 306b of the trench 306 and on the semiconductor substrate 302. In some embodiments of the present disclosure, the first insulating layer 308 may be a high-k dielectric layer.

Figure 9:
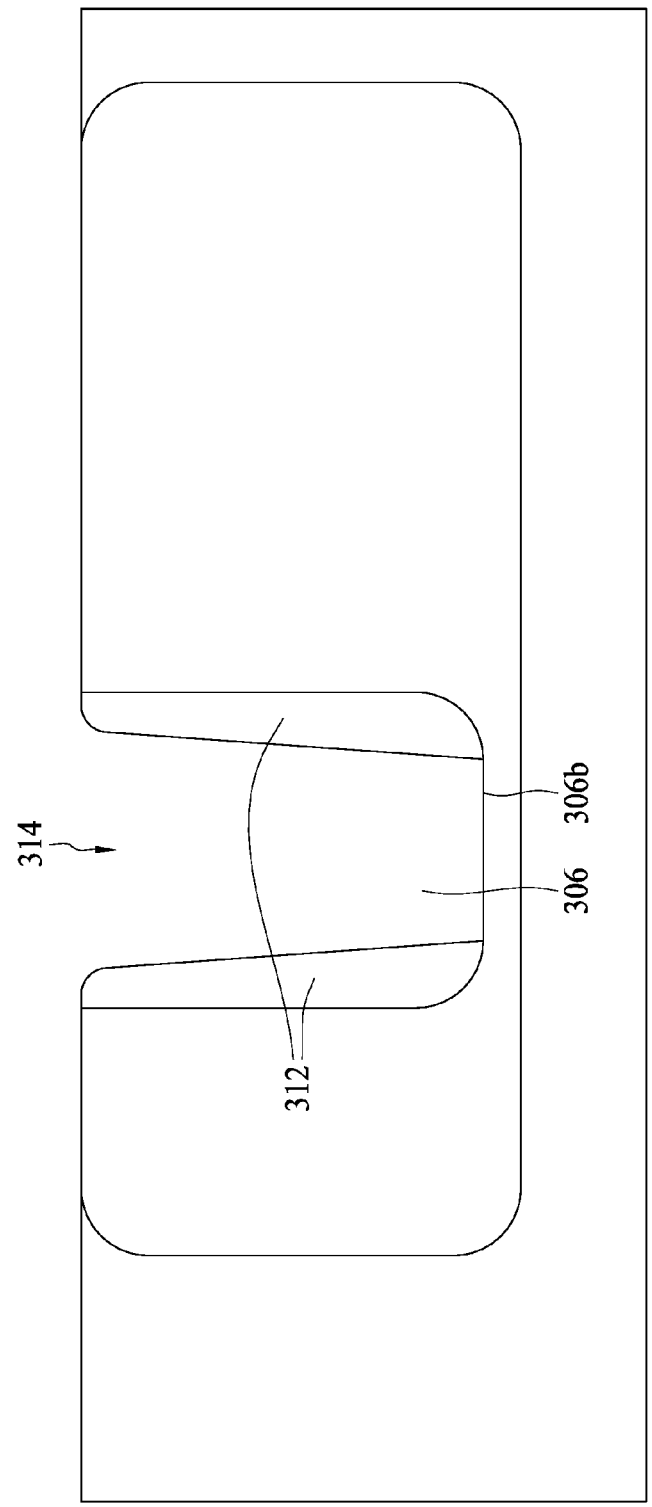

Referring to FIG. 9, the first insulating layer 308 is etched to remove a first portion of the first insulating layer 308 over the top surface of the substrate 302 and a second portion of the first insulating layer 308 over the bottom portion 306a of the trench 306 so as to form a spacer 312 over the inner sidewall portion 306b of the trench 306. The spacer 312 is etched to have an angle θ2 in a range of from about 85 to about 89 degrees with respect to the bottom portion 306a of the trench 306 and a flared opening 314 opposite to the bottom portion 306a of the trench 306.

Figure 10:
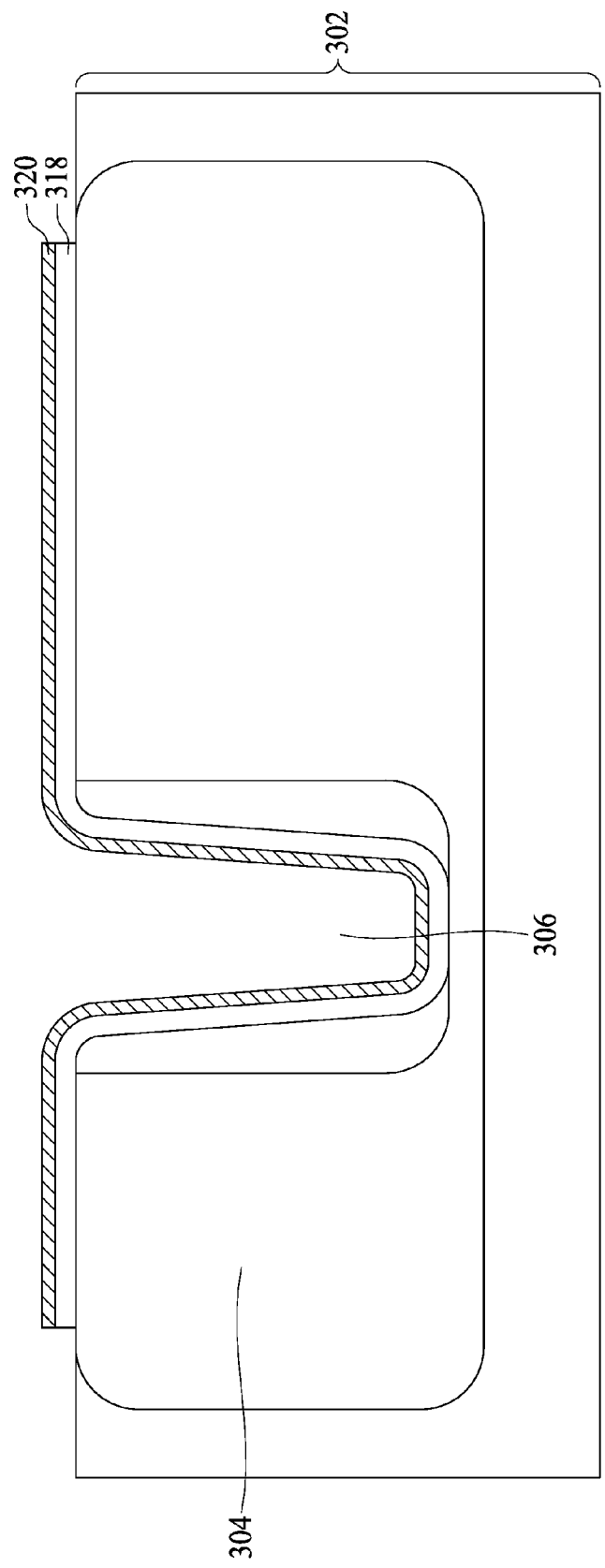

Referring to FIG. 10, a first conductive layer 318 is conformally deposited over the spacer 312 and the bottom portion 306a of the trench 306. A first dielectric layer 320 is conformally deposited over the first conductive layer 318.

Figure 11:
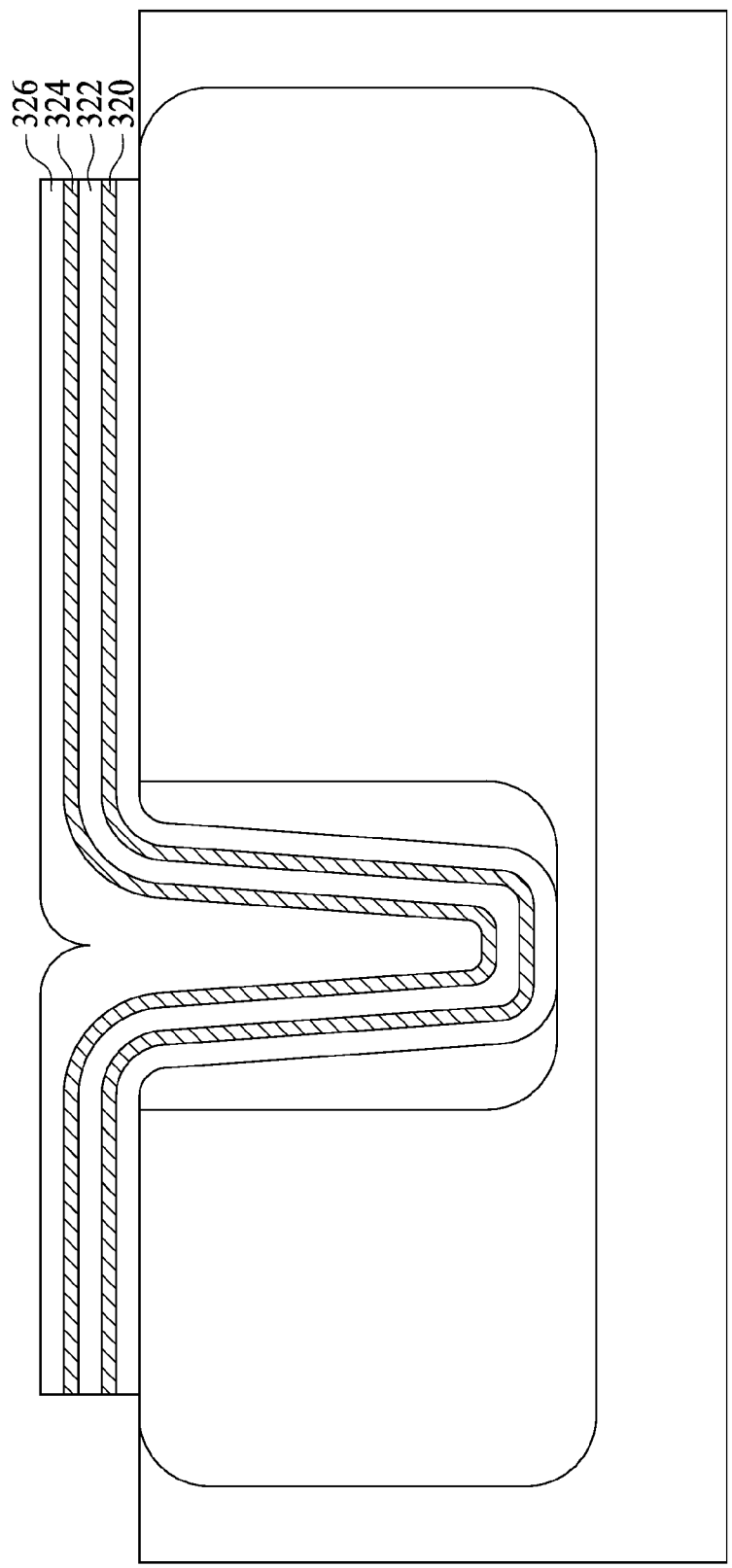

Referring to FIG. 11, a second conductive layer 322 is deposited over the first dielectric layer 320. Then, a second dielectric layer 324 is conformally deposited over the second conductive layer 322. A third conductive layer 326 is conformally deposited over the second dielectric layer 324. In some embodiments of the present disclosure, the first, second and third conductive layers 318, 322, 326 can be made of polysilicon.

Figure 12:
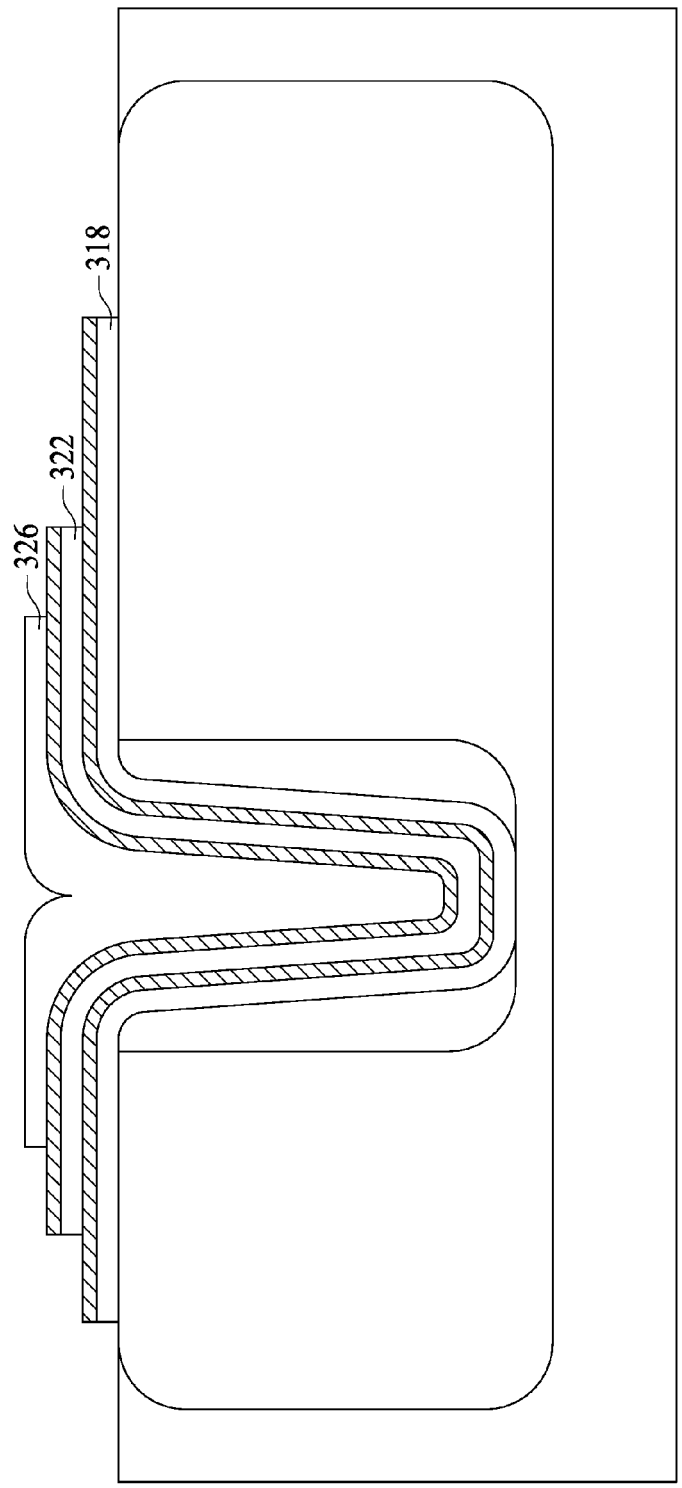

Referring to FIG. 12, photolithography and etching are performed on the third conductive layer 326 to define a third electrode 326 of the capacitor structure. Photolithography and etching are performed on the second conductive layer 322 to define a second electrode 322 of the capacitor structure, and then photolithography and etching are performed on the first conductive layer 318 to define a first electrode 318 of the capacitor structure.

Figure 13:
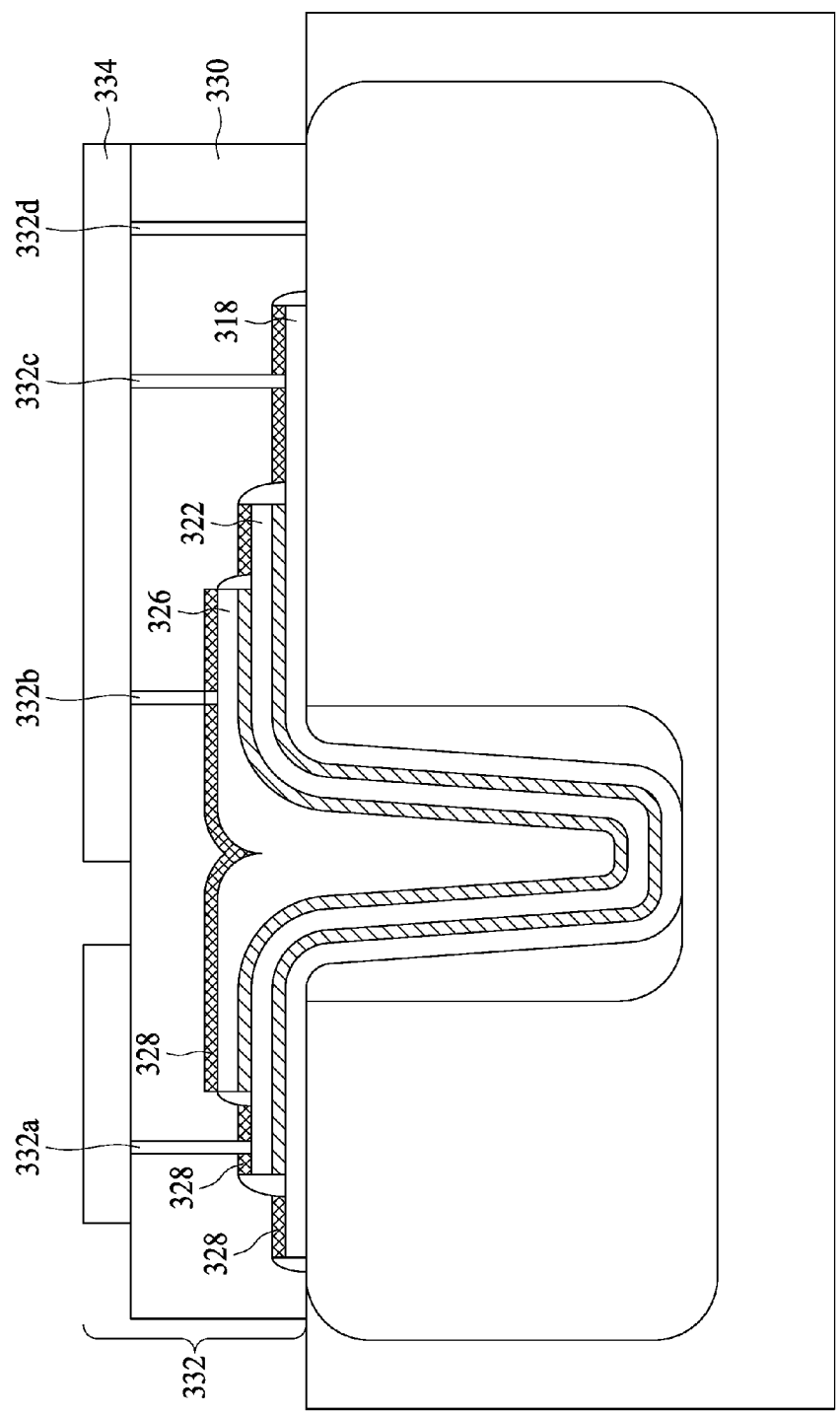

Referring to FIG. 13, a self-aligned silicide (salicide) operation is then performed on the first conductive layer 318, the second conductive layer 322, and the third conductive layer 326 to form a silicide layer 328 only on the exposed top surface of the conductive layers 318, 322, 326. An interlayer dielectric (ILD) layer 330 is formed over the silicide layer 328. An interconnect structure including contacts 332a-332d and a metal layer 334 are formed in and over the ILD layer 330.

Figure 14:
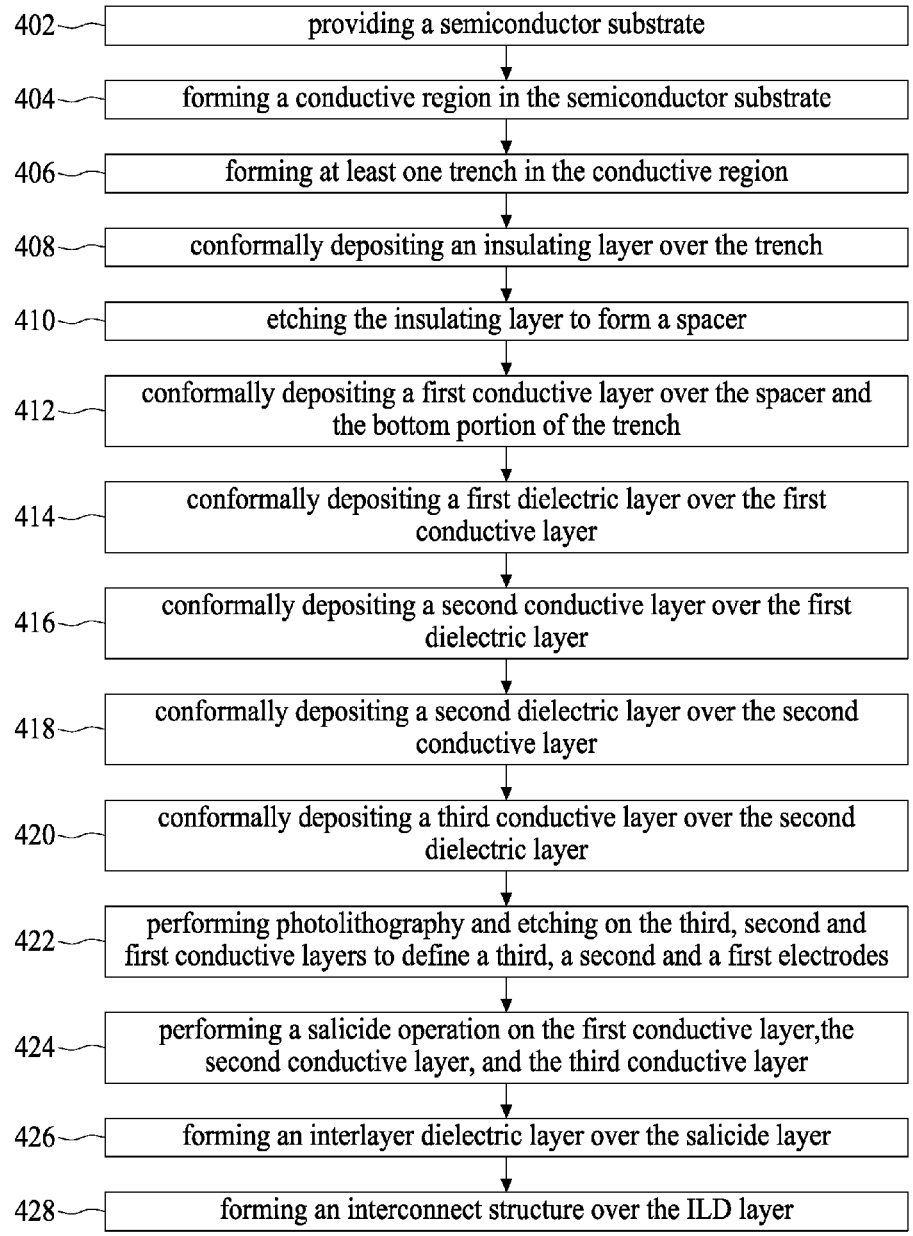
FIG. 14 is a flow-chart illustrating an exemplary method for manufacturing the capacitor structure shown in FIG. 13.

FIG. 14 is a flow-chart illustrating an exemplary method for manufacturing the capacitor structure shown in FIG. 13. It will be appreciated that, for purposes of simplicity and readability, some steps may be omitted from what is illustrated and described below, and that other steps may be used in addition to (or in place of) those illustrated and described below. Referring to FIG. 14 and the structures shown in FIGS. 8-13, the manufacturing method of the present disclosure is described below.

Referring to FIG. 14, in operation 402, a semiconductor substrate 302 is provided. The semiconductor substrate 302 can be a bulk semiconductor wafer having a first conductivity type at a first doping concentration. For example, the semiconductor substrate 302 can be a silicon wafer that is lightly doped with a p-type dopant, or can be heavily doped with a p-type dopant. The semiconductor substrate 302 can be implemented as a bulk silicon wafer substrate, a binary compound substrate (e.g., GaAs wafer), a ternary compound substrate (e.g., AlGaAs), or higher order compound wafers, among others. Further, the semiconductor substrate 302 can also include non-semiconductor materials such as oxide in silicon-on-insulator (SOI), partial SOI substrate, polysilicon, amorphous silicon, or organic materials, among others. In some embodiments of the present disclosure, the semiconductor substrate 302 can include multiple wafers or dies which are stacked or otherwise adhered together.

In operation 404, a conductive region 304 is formed in the semiconductor substrate 302. The conductive region 304 has a second doping type that is opposite the first doping type. In operation 406, at least one trench 306 is formed in the conductive region 304. The at least one trench 306 is formed by providing a trench mask (not shown), and performing etching (e.g., a plasma etch) with the trench mask in place.

The trench mask can be a photoresist mask or a hard mask, such as an oxide or a nitride mask for example. The trench 306 has a bottom portion 306a and an inner sidewall portion 306b. In operation 408, an insulating layer 308 is conformally deposited over the bottom portion 306a and the inner sidewall portion 306b of the trench 306. In some embodiments of the present disclosure, the insulating layer 308 may be an oxide layer.

In operation 410, the insulating layer 308 is etched to remove a first portion of the insulating layer 308 over the top surface of the substrate 302 and a second portion of the insulating layer 308 over the bottom portion 306a of the trench 306 so as to form a spacer 312 over the inner sidewall portion 306b of the trench 306. The spacer 312 is etched to have an angle θ2 in a range of from about 85 to about 89 degrees with respect to the bottom portion 306a of the trench 306 and a flared opening 314 opposite to the bottom portion 306a of the trench 306.

In operation 412, a first conductive layer 318 is conformally deposited over the spacer 312 and the bottom portion 306a of the trench 306. In some embodiments of the 1o present disclosure, the first conductive layer 318 is formed by in-situ doped low-pressure CVD. In other embodiments, the first conductive layer 318 can also be formed of conductive materials other than polysilicon, such as metal for example. In operation 414, a first dielectric layer 320 is conformally deposited over the first conductive layer 318. To form the first dielectric layer 320 over the first conductive layer 318 within the trench 306, a well-known three step process can be used to achieve consistent conformal deposition over the workpiece features. In a first step, a thermal oxidation can be performed to form a thin oxide layer. In a second step, a low pressure chemical vapor deposition (CVD) is provided to form a nitride layer over the oxide layer. In a third step, another oxidation step is performed, such that the first dielectric layer can be an oxide-nitride-oxide (ONO) structure. In some embodiments of the present disclosure, the first dielectric layer 320 can be made of a metal oxide or high K dielectrics. Examples of these include HfO, Al$_2$O$_3$, ZrO, Ta$_2$O$_5$ and the like.

In operation 416, a second conductive layer 322 is deposited over the first dielectric layer 320. In some embodiments of the present disclosure, the second conductive layer 322 is formed by in-situ doped low-pressure CVD. In other embodiments, the second conductive layer 322 can also be formed of conductive materials other than polysilicon, such as metal for example. In operation 418, a second dielectric layer 324 is conformally deposited over the second conductive layer 322. To form the second dielectric layer 324 over the second conductive layer 322 within the trench 306, a well-known three step process can be used to achieve consistent conformal deposition over the workpiece features. In a first step, a thermal oxidation can be performed to form a thin oxide layer. In a second step, a low pressure chemical vapor deposition (CVD) is provided to form a nitride layer over the oxide layer. In a third step, another oxidation step is performed, such that the first dielectric layer can be an oxide-nitride-oxide (ONO) structure. In some embodiments of the present disclosure, the second dielectric layer 324 can be made of a metal oxide or high K dielectrics. Examples of these include HfO, Al$_2$O$_3$, ZrO, Ta$_2$O$_5$ and the like.

In operation 420, a third conductive layer 326 is conformally deposited over the second dielectric layer 324. In some embodiments of the present disclosure, the third conductive layer 326 is formed by in-situ doped low-pressure CVD. In other embodiments, the third conductive layer 326 can also be formed of conductive materials other than polysilicon, such as metal for example. In operation 422, photolithography and etching are performed on the third, second and first conductive layers to define a third, second and first electrodes of the capacitor structure, respectively.

In operation 424, a self-aligned silicide (salicide) operation is then performed on the first conductive layer 318, the second conductive layer 322, and the third conductive layer 326 to form a silicide layer 328 only on the exposed top surface of the conductive layers 318, 322, 326. In operation 426, an interlayer dielectric (ILD) layer 330 is formed over the silicide layer 328. In some embodiments of the present disclosure, the ILD 330 has a thickness of approximately 1000 angstroms and a dielectric constant ranging from approximately 3.0 to approximately 8.5, although other thicknesses and dielectric constants could also be used.

In operation 428, an interconnect structure 332 including contacts 332a-332d and a metal layer 334 is formed over the ILD layer 330. In this way, as shown in FIG. 13, the capacitor structure 300 of the present disclosure is formed.

The capacitor structure 300 shown in FIG. 13 is similar to the capacitor structure 100 shown in FIG. 6 except that the spacer 312 is made of an insulator such as an oxide and the spacer 112 is made of polysilicon. The first electrode 318 contacts the conductive region 304 at the bottom portion 306a of the trench 306, whereas the first insulating layer 108 is disposed between the first electrode 118 and the conductive region 104 at the bottom portion 106a of the trench 106.

Some embodiments of the present disclosure provide a capacitor structure, including a substrate having a conductive region; a trench in the conductive region and having a bottom portion and an inner sidewall portion; a spacer over the inner sidewall portion of the trench; a first conductive layer over the bottom portion and the spacer in the trench; a first dielectric layer over the first conductive layer and in the trench; a second conductive layer over the first dielectric layer and in the trench; and a second dielectric layer over the second conductive layer and in the trench, wherein the spacer comprises an angle in a range of from about 85 to about 89 degrees with respect to the bottom portion of the trench and comprises a flared opening opposite to the bottom portion of the trench.

Some embodiments of the present disclosure provide a method for manufacturing a capacitor structure, including forming a conductive region in a substrate; forming a trench with a bottom portion and an inner sidewall portion in the conductive region; conformally depositing a polysilicon layer over the trench; etching the polysilicon layer to form a spacer over the inner sidewall portion of the trench; conformally depositing a first conductive layer over the bottom portion and the spacer; conformally depositing a first dielectric layer over the first conductive layer; conformally depositing a second conductive layer over the first dielectric layer; and conformally depositing a second dielectric layer over the second conductive layer, wherein the spacer is etched to have an angle in a range of from about 85 to about 89 degrees with respect to the bottom portion of the trench and a flared opening opposite to the bottom portion of the trench.

Some embodiments of the present disclosure provide a method for manufacturing a capacitor structure, including steps of forming a conductive region in a substrate; forming a trench with a bottom portion and an inner sidewall portion in the conductive region; forming an insulating layer in the trench and on the substrate; etching the insulating layer to form a spacer over the inner sidewall portion of the trench;

forming a first conductive layer over the bottom portion and the spacer; forming a first dielectric layer over the first conductive layer; forming a second conductive layer over the first dielectric layer; and forming a second dielectric layer over the second conductive layer, wherein the spacer is formed to have an angle in a range of from about 85 to about 89 degrees with respect to the bottom portion of the trench and a flared opening opposite to the bottom portion of the trench.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a capacitor structure, comprising:
   forming a conductive region in a substrate;
   forming a trench with a bottom portion and an inner sidewall portion in the conductive region;
   conformally depositing a polysilicon layer over the trench;
   etching the polysilicon layer to form a spacer over the inner sidewall portion of the trench;
   conformally depositing a first conductive layer over the bottom portion and the spacer;
   conformally depositing a first dielectric layer over the first conductive layer;
   conformally depositing a second conductive layer over the first dielectric layer; and
   conformally depositing a second dielectric layer over the second conductive layer,
   wherein the spacer is etched to have an angle in a range of from about 85 to about 89 degrees with respect to the bottom portion of the trench and a flared opening opposite to the bottom portion of the trench.

2. The method of claim 1, further comprising forming a first insulating layer in the trench before forming the polysilicon layer.

3. The method of claim 1, further comprising forming a second insulating layer over the bottom portion of the trench before forming a first conductive layer.

4. The method of claim 1, wherein the first conductive layer and the second conductive layer are made of polysilicon.

5. The method of claim 1, wherein the first conductive layer and the second conductive layer are defined as a first electrode and a second electrode of the capacitor structure by photolithography and etching, respectively.

6. The method of claim 1, further comprising:
   performing a salicide operation over the first conductive layer and the second conductive layer;
   forming an interlayer dielectric (ILD) layer over the salicide layer; and
   forming a metal layer over the ILD layer.

7. A method for manufacturing a capacitor structure, comprising:
   forming a conductive region in a substrate;
   forming a trench with a bottom portion and an inner sidewall portion in the conductive region;
   forming an insulating layer in the trench and on the substrate;
   etching the insulating layer to form a spacer over the inner sidewall portion of the trench;
   forming a first conductive layer over the bottom portion and the spacer;
   forming a first dielectric layer over the first conductive layer;
   forming a second conductive layer over the first dielectric layer; and
   forming a second dielectric layer over the second conductive layer,
   wherein the spacer is formed to have an angle in a range of from about 85 to about 89 degrees with respect to the bottom portion of the trench and a flared opening opposite to the bottom portion of the trench.

8. The method of claim 7, wherein the first conductive layer and the second conductive layer are made of polysilicon.

9. The method of claim 7, wherein the forming the insulating layer comprises depositing a high-k dielectric layer.

10. The method of claim 7, wherein the forming the first conductive layer comprises conformally depositing a polysilicon layer electrically connected with the conductive region of the substrate.

11. A method for manufacturing a capacitor structure, comprising:
    forming a conductive region in a substrate;
    forming a trench with a bottom portion and an inner sidewall portion in the conductive region;
    forming a spacer at the inner sidewall portion of the trench;
    conformally depositing a first conductive layer over the bottom portion and the spacer;
    conformally depositing a first dielectric layer over the first conductive layer;
    conformally depositing a second conductive layer over the first dielectric layer; and
    conformally depositing a second dielectric layer over the second conductive layer,
    wherein the spacer comprises an angle in a range of from about 85 to about 89 degrees with respect to the bottom portion of the trench and a flared opening opposite to the bottom portion of the trench.

12. The method of claim 11, wherein the flared opening is narrower in proximity to the bottom portion of the trench.

13. The method of claim 11, wherein forming the spacer comprises depositing polysilicon.

14. The method of claim 13, further comprising forming an insulating layer between the first conductive layer and the substrate at the bottom portion of the trench.

15. The method of claim 11, wherein forming the spacer comprises depositing an oxide.

16. The method of claim 15, wherein the first conductive layer and the substrate are electrically connected at the bottom portion of the trench.

17. The method of claim 11, wherein the first conductive layer and the second conductive layer comprise polysilicon.

18. The method of claim 17, further comprising forming an interlayer dielectric (ILD) layer over the first conductive layer.

19. The method of claim 18, further comprising forming a silicide layer between the ILD layer and the first conductive layer.

20. The method of claim 18, further comprising forming a metal layer over the ILD layer.

* * * * *